(12) United States Patent
Yamane

(10) Patent No.: US 6,642,143 B2
(45) Date of Patent: Nov. 4, 2003

(54) METHOD OF PRODUCING SEMICONDUCTOR DEVICE

(75) Inventor: Chigusa Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/037,989

(22) Filed: Oct. 23, 2001

(65) Prior Publication Data

US 2002/0119653 A1 Aug. 29, 2002

(30) Foreign Application Priority Data

Oct. 25, 2000 (JP) ................................. P2000-326136

(51) Int. Cl.$^7$ ............................................ H01L 2/4763
(52) U.S. Cl. ........................................ 438/637; 438/680
(58) Field of Search ................................. 438/637, 655, 438/667, 668, 669, 672, 673, 675, 680, 682, 683, 685, 686, 689, 700, 706, 733, 745, 770, 905

(56) References Cited

U.S. PATENT DOCUMENTS 6,107,192 A * 8/2000 Subrahmanyan et al. ... 438/683
6,352,591 B1 * 3/2002 Yieh et al. ................. 118/697

* cited by examiner

Primary Examiner—David Nhu
(74) Attorney, Agent, or Firm—Sonnenschein, Nath & Rosenthal LLP

(57) ABSTRACT

A method of producing a semiconductor device able to prevent a change of shape of a contact hole and to form a contact having a low resistivity and low variability in resistivity, comprising the steps of: forming a conductive layer in a substrate; forming an insulating layer on the conductive layer; forming an opening used as the contact hole in the insulating layer to penetrate and reach the conductive layer; and removing native oxide formed on a surface of the conductive layer at a bottom of the opening by plasma etching and using an etching gas containing a fluorine compound gas at a predetermined concentration in a predetermined pressure wherein the concentration and pressure are determined within a range able to control an etching amount of the native oxide.

15 Claims, 18 Drawing Sheets

METHOD OF PRODUCING SEMICONDUCTOR DEVICE

BACKGROUND OF THE INVENTION

1. Field of the Invention

The present invention relates to a method of producing a semiconductor device, more particularly relates to a method of producing a semiconductor device able to form a contact having a low resistivity and less variability in resistivity even if an aspect ratio is high.

2. Description of the Related Art

As a related art, a method of producing a contact hole will be explained with reference to FIGS. 1A to 1I.

First, as shown in FIG. 1A, a silicon substrate 1 is formed with an interlayer insulating film 2 comprised of for example a silicon oxide film. Alternatively, an interconnection layer comprised of metal can be used in place of the silicon substrate 1.

Next, as shown in FIG. 1B, a photolithography step is used to form a resist 3. Using the resist 3 as a mask, the interlayer insulating film 2 is etched to form an opening 4. After this, as shown in FIG. 1C, the resist 3 is removed. The silicon substrate 1 at the bottom of the opening 4 is therefore formed with a native oxide 5.

Next, as shown in FIG. 1D, reaction products deposited at the hatching part due to the etching for forming the opening 4 and the native oxide 5 are removed. Next, as shown in FIG. 1E, the opening 4 and the interlayer insulating film 2 are formed with a barrier metal layer 6 by for example chemical vapor deposition (CVD). After this, as shown in FIG. 1F, the barrier metal layer 6 is formed with a plug metal layer 7a comprised of for example tungsten (W) or another refractory metal by sputtering.

Next, as shown in FIG. 1G, the plug metal layer 7a and barrier metal layer 6 are etched back. Due to this, the opening 4 is formed with a plug 7 via the barrier metal layer 6. Next, as shown in FIG. 1H, the entire surface including the surface of the opening 4 is formed with an interconnection metal layer 8a comprised of for example aluminum (Al) or Al alloy. Here, a barrier metal layer comprised of Ti etc. can be formed on the interlayer insulating film 2 and plug 7 before the interconnection metal layer 8a is formed in the same way as the barrier metal 6 in the opening 4.

After this, using a not shown resist as a mask, the interconnection metal layer 8a is etched for forming interconnections 8 as shown in FIG. 1I. Due to the above process, a contact hole connecting the silicon substrate 1 or conductive layer and the upper interconnection layer 8 is formed.

In the above conventional method of forming a contact hole, while the native oxide 5 in the opening 4 is removed as a pre-treatment of forming the barrier metal layer 6, this process is often performed by wet-etching or argon (Ar) sputtering. A solution containing hydrofluoric acid (HF) is used for the wet-etching. Wet-etching has an advantage of a low cost of process.

On the other hand, Ar sputtering has become popularly employed as the aspect ratios of contact holes have increased. Since Ar sputtering can be performed using a conventional sputtering system, it is possible to form in-situ an interconnection or barrier metal layer by sputtering after removing a native oxide.

In recent years, the miniaturization of semiconductor devices has been accompanied by a miniaturization of contact holes and increase of aspect ratios. In the step of forming the barrier metal layer 6 shown in FIG. 1E, the aspect ratio becomes for example 7 or more. Even if the aspect ratio is a high one where a top diameter of the opening 4 is 0.4 μm, a bottom diameter is 0.22 pm, and a height of the opening 4 is equal to a thickness of the interlayer insulating film 2 of 3 μm, it is necessary to remove thoroughly the native oxide at the bottom of the opening 4 and the deposit on the sidewall of the opening 4.

However, according to the wet-etching or Ar sputtering described above, along with the increase of the aspect ratio, the following problems have becomes prominent. Due to this, the increase in resistivity in a contact hole having a high aspect ratio has becomes a serious problem.

When the wet-etching is performed in the step shown in FIG. 1D, as shown in FIG. 2A, a center part in a vertical direction is more easily etched in its sidewall (the interlayer insulating film 2) compared to the top and bottom of the opening 4. Along with the increase of the aspect ratio, the time required for wet-etching has become longer. Therefore, etching progresses particularly at the center part in the vertical direction of the opening 4 and therefore the opening 4 forms a barrel shape after the etching.

Due to this, it becomes impossible to fill the opening 4 with the plug metal layer 7a comprised of for example W with a good step coverage. Consequently, as shown in FIG. 2B, the plug 7 forming a part of the interconnections is formed with voids 9.

Also, as shown in FIG. 2A, the top diameter of the opening 4 becomes larger due to wet-etching. The dotted lines in FIG. 2A show an opening width of the resist 3 (see. FIG. 1B). When the top diameter of the opening 4 becomes larger, it becomes difficult to maintain a withstand voltage between contact holes next to each other. In the worst case, there is a short-circuit between the contact holes.

In the case of Ar sputtering, it suffers from the disadvantage that the resistivity rises due to damage on the contact part. In a contact hole of a high aspect ratio, when Ar sputtering is performed, as shown in FIG. 3A, the native oxide 5 is not removed uniformly at the bottom of the opening 4 and often remains near the sidewall of the opening 4. If the barrier metal 6 and plug 7 etc. are formed from this state as shown in FIG. 3B, a contact resistivity rises.

For the purpose of removing the native oxide 5 thoroughly and obtaining a predetermined resistivity, sputtering is performed by a certain amount on not only the native oxide 5 but also the surface of the underlying silicon substrate 1. If the sputtering is performed excessively, a contact 10 is damaged. For example, when the surface of the silicon substrate 1 is damaged and made amorphous, the reactivity of the barrier metal layer 6 formed above the silicon decreases and defects more easily appear at an interface.

Alternatively, when the sputtering is performed excessively, sputtered material may re-deposit at the contact part 10 and the resistivity may rise.

As described above, in the case of Ar sputtering, in both cases of inadequate sputtering and excessive sputtering, the resistivity of the contact part increases.

A pre-treatment method for forming interconnections able to overcome the above disadvantages without changing the shape of a contact hole and prevent an increase in resistivity at the contact part has been desired. As another pre-treatment method than wet-etching and Ar sputtering, plasma etching can be mentioned.

For example, Japanese Unexamined Patent Publication (Kokai) No. 4-186827 discloses a method of producing a semiconductor device characterized in that a gas containing fluorine is used as an etching gas and hydrogen gas is added for plasma etching before a contact hole is buried with metal. When reactive ion etching (RIE) is performed using a halide as an etching gas, the etching rate of silicon becomes higher than that of the silicon oxide film and a diffusion layer on the silicon substrate is etched largely.

Therefore, according to the method described in Japanese Unexamined Patent Publication (Kokai) No. 4-186827, hydrogen gas is added for lowering the etching rate of silicon. However, there is no description about the relationship between an inside pressure of a chamber and etching rate. An example shows etching is performed at 26 mTorr.

Also, Japanese Unexamined Patent Publication (Kokai) No. 8-45915 discloses a method of forming a contact hole reaching a surface of a metal layer by dry-etching an insulating layer on the metal layer. The method of forming a contact hole is characterized in that a gas containing a nitrogen atom is added to an etching gas and the amount of the gas containing a nitrogen atom is about 4.5% or more with respect to the etching gas other than the diluting gas. As a gas containing a nitrogen atom, $N_2$, $NH_4$, and $NF_3$ are mentioned.

That invention was made for overcoming the disadvantage that it becomes impossible to remove metal deposited on the resist or sidewall of a contact hole by a subsequent washing step if the surface of the metal layer is sputtered with ions in plasma during dry-etching of the insulating layer. The etching step using an etching gas containing $NF_3$ or another gas containing a nitrogen atom corresponds to the above described step shown in FIG. 1B.

Therefore, after forming the opening reaching the metal layer, the resist is removed and washing is performed in the same way as the step shown in FIG. 1C. An example shows that the photoresist and the deposit on the side wall of the contact hole are removed by washing with nitric acid and following washing with purified water.

As described above, the plasma etching described in Japanese Unexamined Patent Publication (Kokai) No. 8-45915 is applied to a step of forming the opening. It is expected that native oxide will be formed on the surface of the metal layer at the bottom of the opening after removing the resist and washing. Therefore, another treatment is required for removing the native oxide.

Japanese Unexamined Patent Publication (Kokai) No. 8-330537 describes a method of producing a semiconductor device comprising a step of forming in an interlayer insulating film formed on a semiconductor substrate a contact hole wherein the semiconductor substrate is exposed, a step of removing a native oxide at the bottom of the contact hole by plasma etching, and a step of forming an interconnection layer connecting to the semiconductor substrate via the contact hole. The method of production is characterized in that plasma etching is performed in a chemical dry etching (CDE) system wherein a plasma generating chamber and an etching reaction chamber are separated, $NF_3$ is used as an etching gas, and the etching reaction chamber is made lower in pressure than the plasma generating chamber.

This invention was made for overcoming the disadvantage that the side wall of the contact hole is etched due to wet-etching or isotropic etching. When using anisotropic dry-etching, damage to the substrate becomes a problem in the same way as the Ar sputtering described above, while the change in shape of the contact hole due to isotropic dry-etching becomes problematic in the same way as wet-etching.

According to the etching method described in the Japanese Unexamined Patent Publication (Kokai) No. 8-330537, by separating the plasma generating chamber and etching reaction chamber, electrons having a low mass and high mobility are moved to a side wall of the plasma generating chamber. Due to this, a sheath is formed at the side wall of the plasma generating chamber. Due to the sheath, charged radicals are accelerated and strike the side wall of the plasma generating chamber. Non-charged neutral radicals move into the etching reaction chamber and participate in the etching.

Since the inside pressure of the etching reaction chamber is lower than that of the plasma generating chamber, the mean free path of the neutral radicals entering the etching reaction chamber becomes longer. Due to this, the neutral radicals enter the contact hole in a predetermined direction.

According to this method of production, the etching gas is restricted to $NF_3$ and other gases are not added for controlling the etching rate. The neutral radicals of low energy are selectively used for etching to prevent damage to the substrate. The inside pressure of the etching reaction chamber is controlled for guiding the entering neutral radicals. Also, nothing in particular is described regarding application to anything other than surface of the semiconductor substrate, for example, the surface of a metal layer. Further, since the plasma generating chamber and etching reaction chamber are separated, it is difficult to perform in-situ metal CVD for forming an interconnection layer after treatment for removing the native oxide.

Japanese Unexamined Patent Publication (Kokai) No. 4-72621 discloses a method of forming a semiconductor device characterized by etching native oxide in an atmosphere of a high temperature, preferably as much as 850° C., and a high vacuum state where fluorine gas and hydrogen are introduced. According to the method, due to the addition of hydrogen gas into the fluorine compound gas, the concentration of fluorine radicals is adjusted and the etching rate of the silicon oxide is controlled to improve a selection ratio of silicon oxide and silicon.

As the fluorine compound gas, $NF_3$, $SF_6$, $CF_4$, etc. are mentioned. When a gas containing carbon is used as the etching gas, it often becomes a problem that reaction products deposit on the sidewall of the contact hole.

Japanese Unexamined Patent Publication (Kokai) Nos.6-338478 and 10-321610 disclosed methods of producing a semiconductor device where native oxide is removed by adding $NF_3$ gas or an $NF_3$-containing gas to an activated gas obtained by changing a hydrogen-containing gas into plasma (hydrogen plasma downflow treatment). Japanese Unexamined Patent Publication (Kokai) No. 6-338478 describes that when $NF_3$ gas is added into the activated gas of hydrogen-containing gas, the treatment time is shortened compared to the case where $NF_3$ gas is not added.

Also, Japanese Unexamined Patent Publication (Kokai) No. 10-321610 describes that it is possible to increase the etching selection ratio of native oxide to another silicon oxide film formed by for example CVD or BPSG (borophosphosilicate glass) and remove the native oxide more selectively by performing the hydrogen plasma downflow treatment described in the above Japanese Unexamined Patent Publication (Kokai) No. 6-338478 at a lower predetermined temperature than room temperature by cooling the wafer.

According to the hydrogen plasma downflow treatment described in the Japanese Unexamined Patent Publication (Kokai) Nos. 6-338478 and 10-321610, $NF_3$ is introduced to regions other than the plasma generating region. Therefore, although $NF_3$ is activated by reacting with the hydrogen radicals, the $NF_3$ is not activated by the electric field of the plasma generating region. When the native oxide is mainly removed by hydrogen radicals, the treatment time becomes longer.

As described above, it is already disclosed to perform pre-treatment for forming interconnections by plasma etching using fluorine compound gases. However, the optimum etching conditions etc. for reducing contact resistivity have not been investigated enough.

SUMMARY OF THE INVENTION

An object of the present invention is to provide a method of producing a semiconductor device able to prevent a change of shape of a contact hole and to form a contact having a low resistivity and low variability in resistivity.

According to the present invention, there is provided a method of producing a semiconductor device comprising the steps of forming a conductive layer in a substrate; forming an insulating layer on the conductive layer; forming an opening used as a contact hole in the insulating layer to penetrate the insulating layer and reach the conductive layer; and removing native oxide formed on a surface of the conductive layer at a bottom of the opening by plasma etching using an etching gas containing a fluorine compound gas at a predetermined concentration in a predetermined pressure wherein the concentration and pressure are determined within a range able to control an etching amount of the native oxide.

Preferably, the fluorine compound gas comprises nitrogen trifluoride ($NF_3$) gas and an upper limit of the predetermined concentration of the $NF_3$ gas is about 10%. Preferably, the etching gas comprises a helium (He) gas. Preferably, the predetermined pressure is not more than about 10 mTorr ($\approx 1.33$ Pa). Preferably, the etching amount is equivalent to about 0.5 to 10 nm of a thermal oxide film. Preferably, the method of producing a semiconductor device of the present invention further comprises the step of forming an interconnection at least in the opening without moving the substrate after the plasma etching.

Preferably, the plasma etching comprises inductively coupled plasma (ICP) etching, parallel plate etching, electron cyclotron resonance (ECR) etching, or high density plasma (HDP) etching.

Preferably, the conductive layer comprises a silicon (Si) layer, refractory metal silicide layer, refractory metal layer, refractory metal nitride layer, aluminum (Al) layer, or Al alloy layer.

More preferably, the refractory metal silicide layer comprises a cobalt silicide ($CoSi_x$) layer, titanium silicide ($TiSi_x$) layer, or tungsten silicide ($WSi_x$) layer.

More preferably, the refractory metal layer comprises a titanium (Ti), tungsten (W) layer, or tantalum (Ta) layer.

More preferably, the refractory metal nitride layer comprises a titanium nitride (TiN) layer, tungsten nitride (WN) layer, or tantalum nitride (TaN) layer. More preferably, the Al alloy layer comprises an Al—Cu layer.

Due to this, it becomes possible to remove native oxide and reduce damage to the underlying layer exposed at the bottom of the opening even when a contact hole is formed at a high aspect ratio. Therefore, the contact resistivity can be decreased. Also, in the method of producing a semiconductor device of the present invention, it is possible to prevent formation of deposits containing carbon in the contact hole by performing plasma etching using $NF_3$.

According to the method of producing a semiconductor device of the present invention, it is also possible to perform pre-treatment by plasma etching in the opening and forming an interconnection layer in the opening in-situ after forming the opening in an interlayer insulating layer.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments of the method of producing a semiconductor device of the present invention will be described with reference to the accompanying drawings.

First Embodiment

Figure 1A:
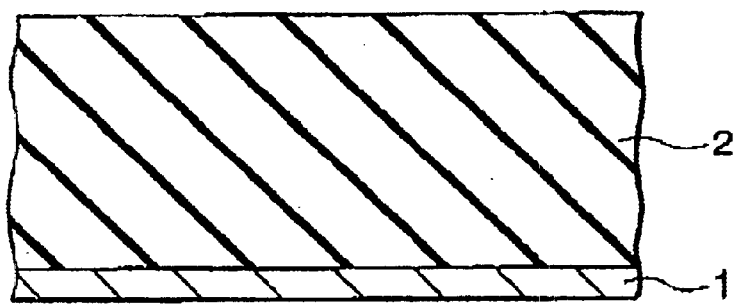
FIGS. 1A to 1I are cross-sectional views of steps of producing a semiconductor device of the related art.
Figure 1B:
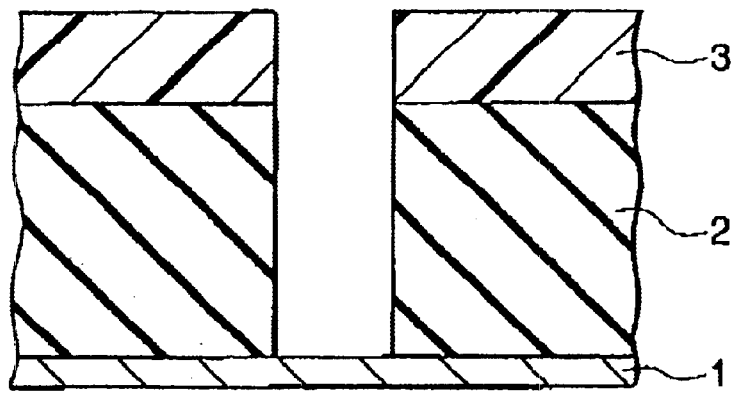
Figure 1C:
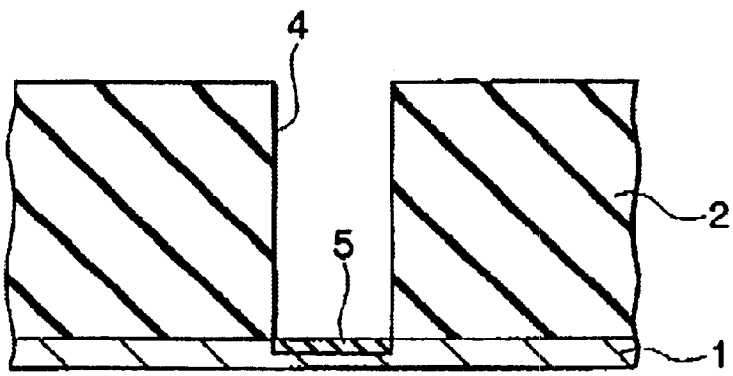
Figure 1D:
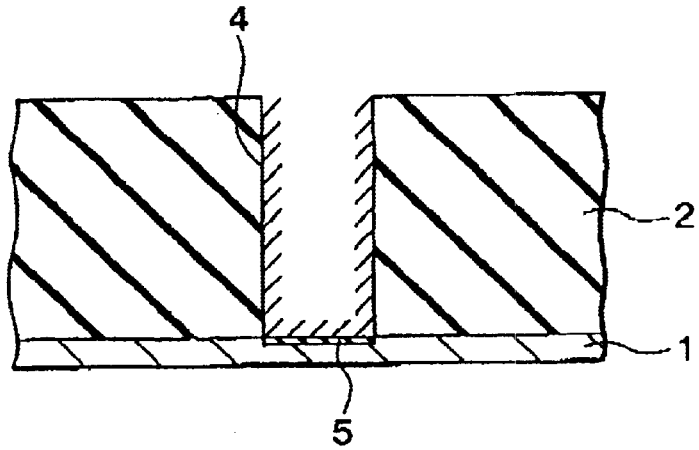
Figure 1E:
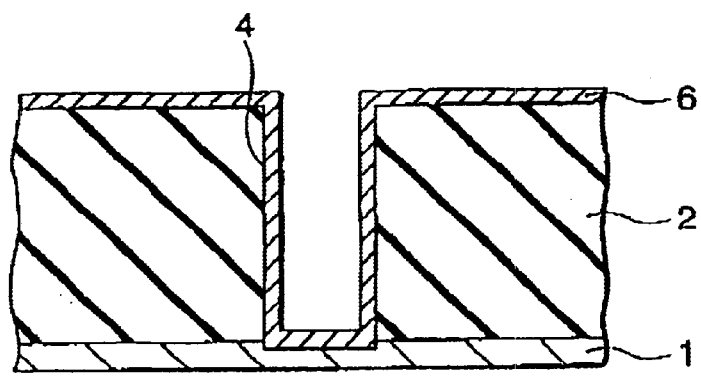
Figure 1F:
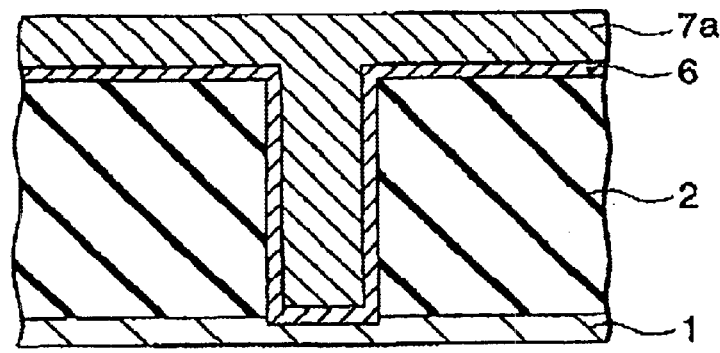
Figure 1G:
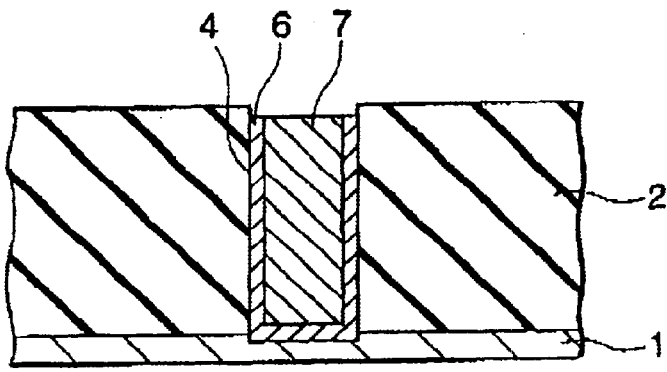
Figure 1H:
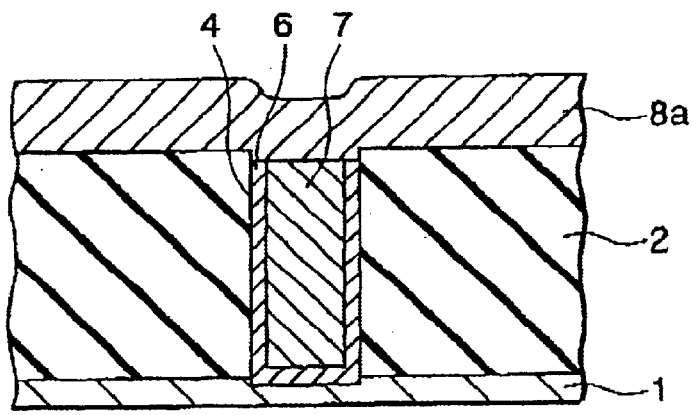
Figure 1I:
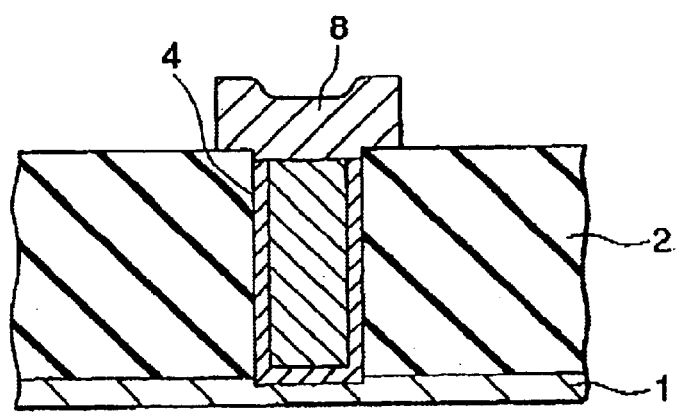
Figure 2A:
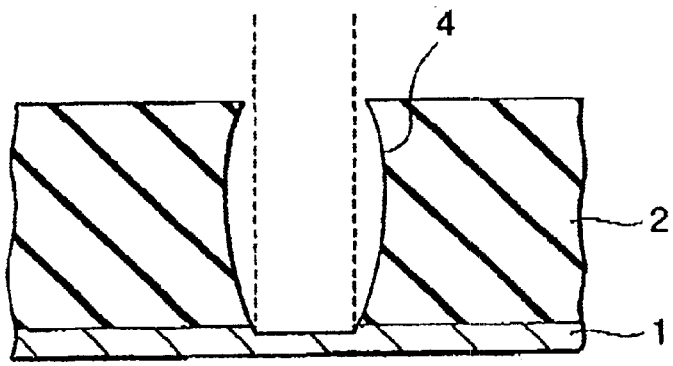
FIGS. 2A and 2B are cross-sectional views showing problems in the case of wet-etching for pre-treatment of forming interconnections in the method of producing a semiconductor device of the related art.
Figure 2B:
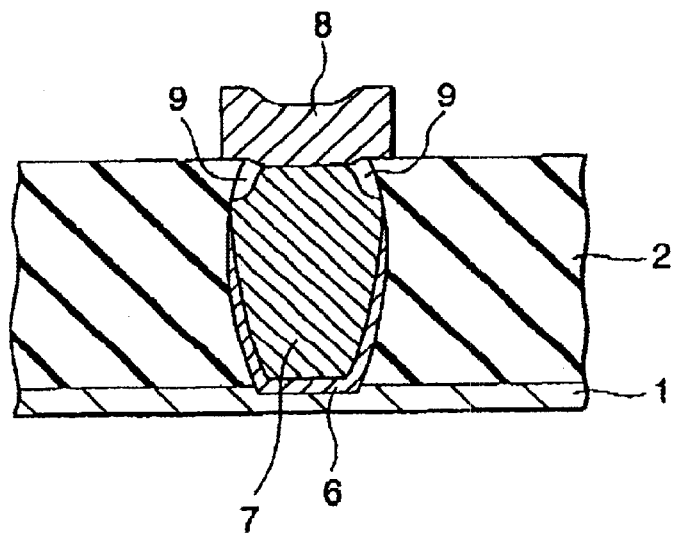
Figure 3A:
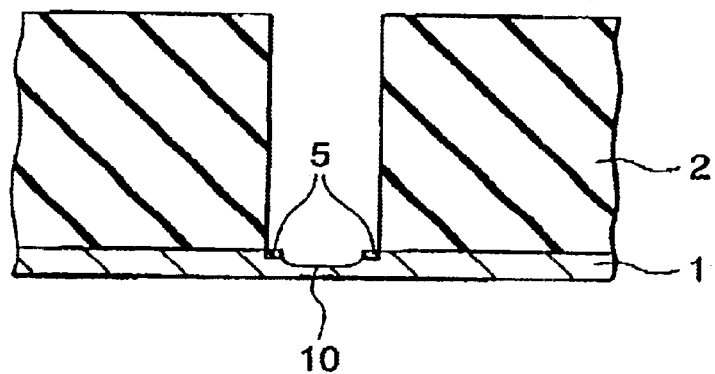
FIGS. 3A and 3B are cross-sectional views showing problems in the case of Ar sputtering for pre-treatment of forming interconnections in the method of producing a semiconductor device of the related art.
Figure 3B:
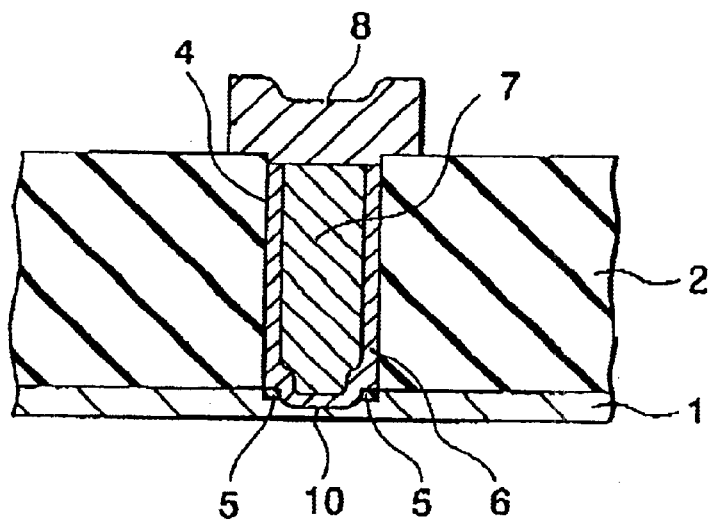
Figure 4:
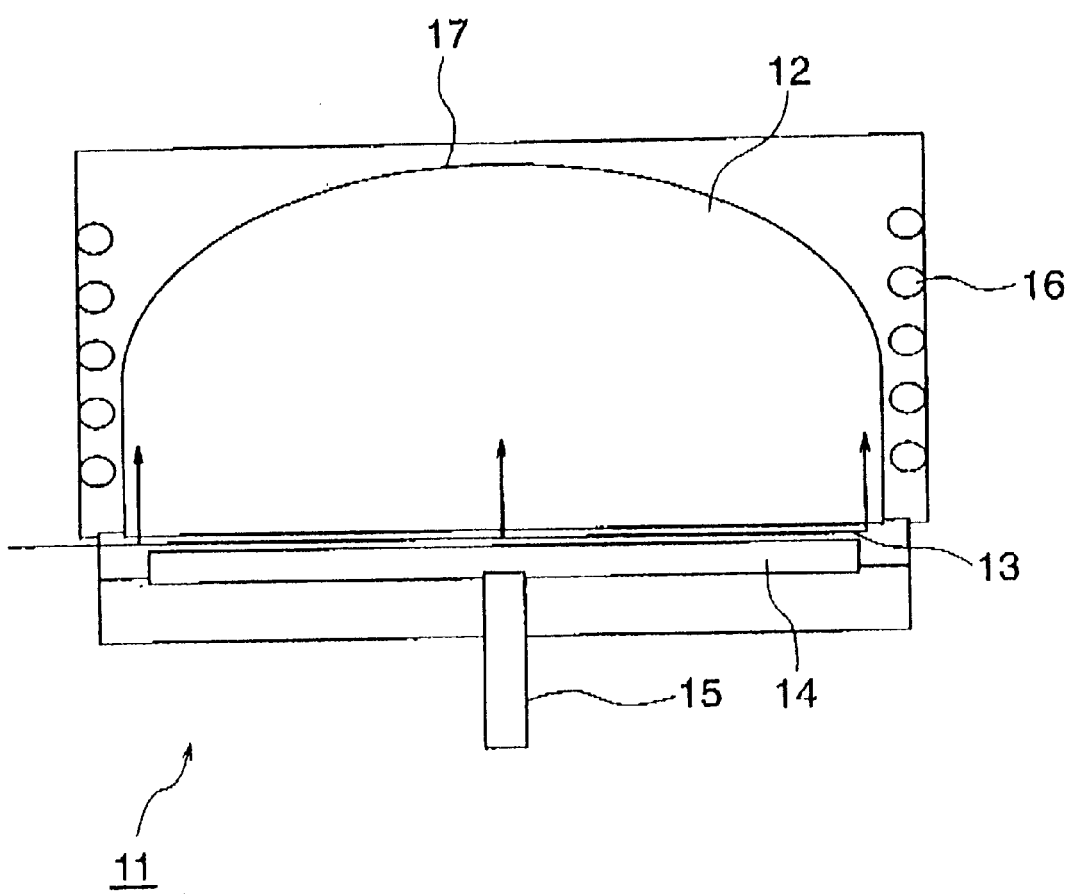
FIG. 4 is a schematic view of an ICP etching system able to be used in a method of producing a semiconductor device of a first embodiment of the present invention.

FIG. 4 is a schematic view of an etching system used for etching native oxide at the bottom of a contact hole in the method of producing a semiconductor device of the present embodiment.

An etching system 11 shown in FIG. 4 is an inductively coupled plasma (ICP) etching system of single wafer treatment type. An etching gas is introduced in the reaction chamber 12 from a gas introduction port 13 in the arrow direction. The gas introduction port 13 is formed in a circle shape in a top view. A wafer 14 is set on a lower electrode 15. A coil-type upper electrode 16 is arranged around a dome 17.

Using the above etching system, a contact hole was formed by the following steps.

Figure 5A:
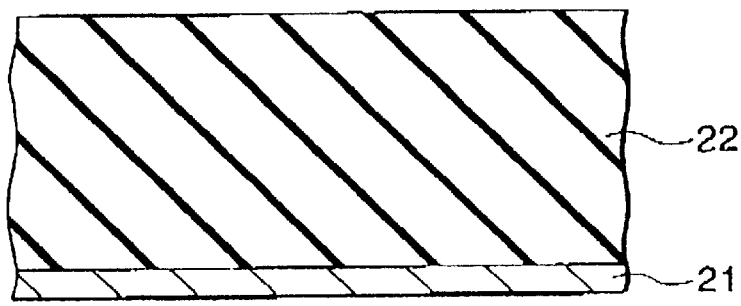
FIGS. 5A to 5I are cross-sectional views of steps of producing a semiconductor device of first to third embodiments of the present invention.
Figure 5B:
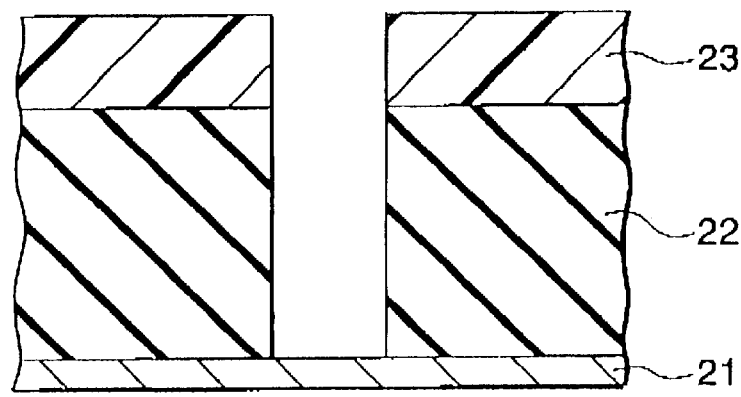
Figure 5C:
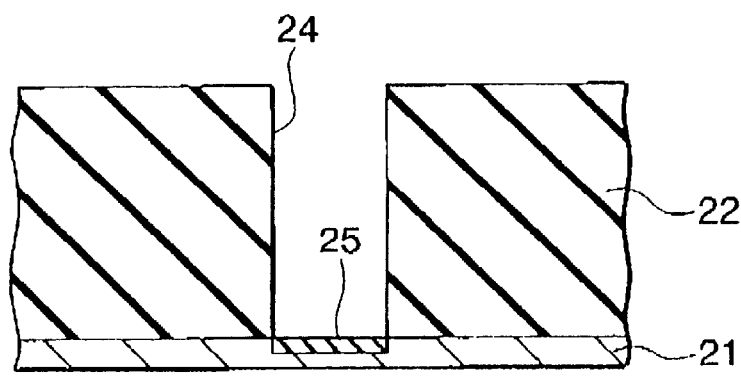

First, as shown in FIG. 5A, a silicon substrate 21 was formed with an interlayer insulating film 22 comprised of for example a silicon oxide film. Next, as shown in FIG. 5B, a resist 23 was formed by a photolithography step. Using the resist 23 as a mask, the interlayer insulating film 22 was etched to form an opening 24. Next, as shown in FIG. 5C, the resist 23 was removed. The surface of the silicon substrate 21 at the bottom of the opening 24 was therefore formed with native oxide 25.

Figure 5D:
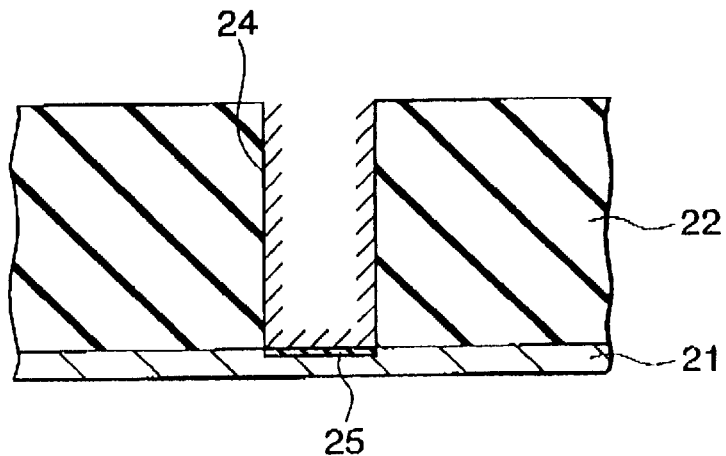

Next, as shown in FIG. 5D, as a pre-treatment of forming interconnections, etching was performed using the etching system shown in FIG. 4. Due to this, reaction products deposited on a part shown by hatching during etching for forming the opening 24 and the native oxide 25 formed at the bottom of the opening 24 were removed.

The etching conditions were an $NF_3$ gas flow of 3 sccm; an He gas flow of 47 sccm; an RF power (1) of 100 W; an RF power (2) of 100 W; a pressure of 4.5 mTorr ($\approx$ 0.6 Pa); and a wafer temperature of room temperature. Here, the RF power (1) is the power of the upper electrode 16 and the RF power (2) is the power of the: lower electrode 15.

Since the native oxide is a thin film having a thickness of about several nm, it is possible to judge whether it is removed, but measurement of the etching rate is difficult in the present state. According to investigation by for example Fourier transform infrared spectroscopy (FT-IR), it is known that the quality of native oxide is more similar to the quality of a thermal oxide film than to the quality of a CVD film or other deposited silicon oxide film. An etching amount of a thermal oxide film can be measured by a film thickness meter.

Therefore, the etching amount of a thermal oxide film was measured for establishing the correlation between the etching time and etching amount. Using this result, the etching amount of a thermal oxide film in a predetermined etching time was deemed equivalent to the etching amount of native oxide and the etching amount of native oxide was converted to that of a thermal oxide film.

In the step shown in FIG. 5D, for the purpose of investigating the relation of etching amount and contact resistivity, etching was performed at four etching amounts (7 nm, 5 nm, 3 nm, 1 nm).

Figure 5E:
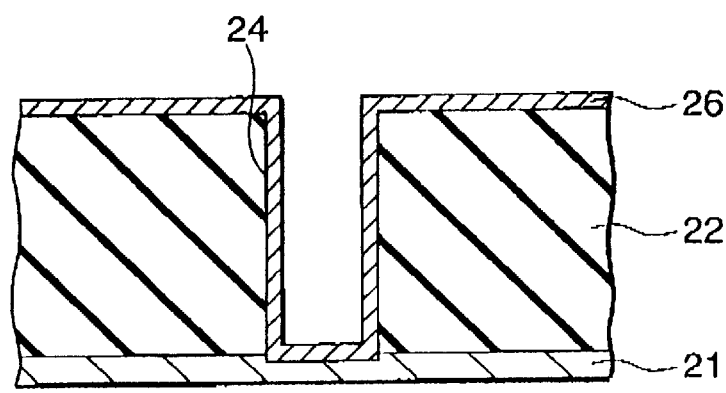
Figure 5F:
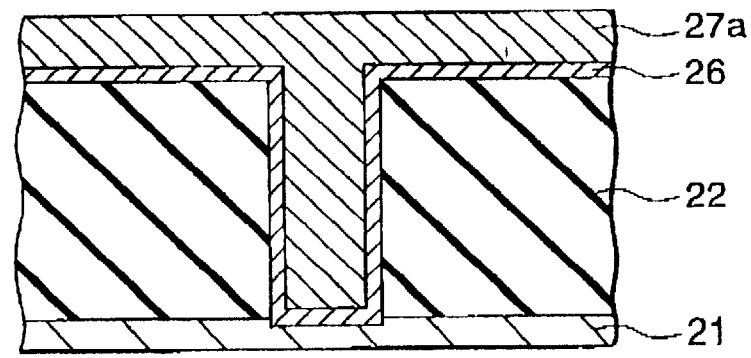

Next, as shown in FIG. 5E, the opening 24 and the interlayer insulating film 22 were formed with a barrier metal layer 26 by for example CVD. This CVD can be performed in-situ after the pre-treatment shown in FIG. 5D. After this, as shown in FIG. 5F, the barrier metal layer 26 was formed by sputtering with a plug metal layer 27a comprised of for example W or another refractory metal.

Figure 5G:
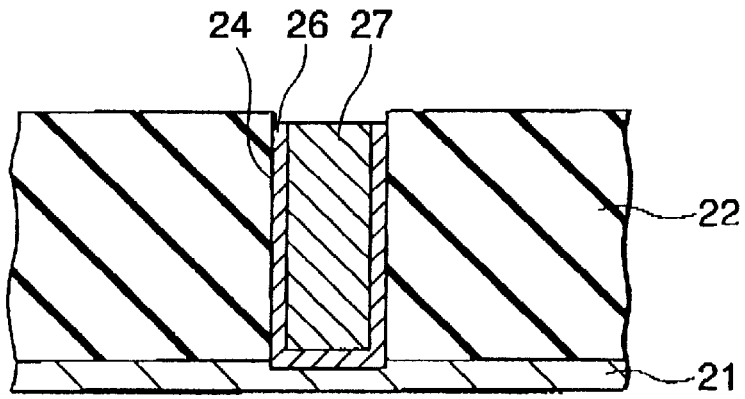
Figure 5H:
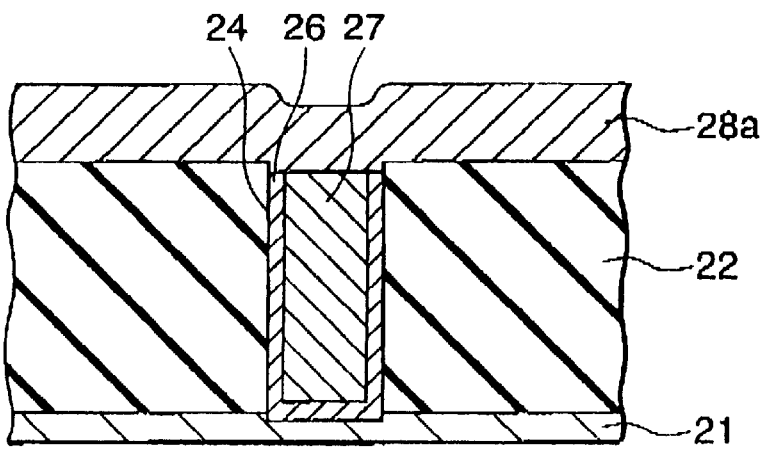

Next, as shown in FIG. 5G, the plug metal layer 27a and barrier metal layer 26 were etched back. Due to this, a plug 27 was formed in the opening 24 via the barrier metal layer 26. Next, as shown in FIG. 5H, the entire surface including on the opening 24 was formed with an interconnection metal layer 28a comprised of for example Al or Al alloy.

Figure 5I:
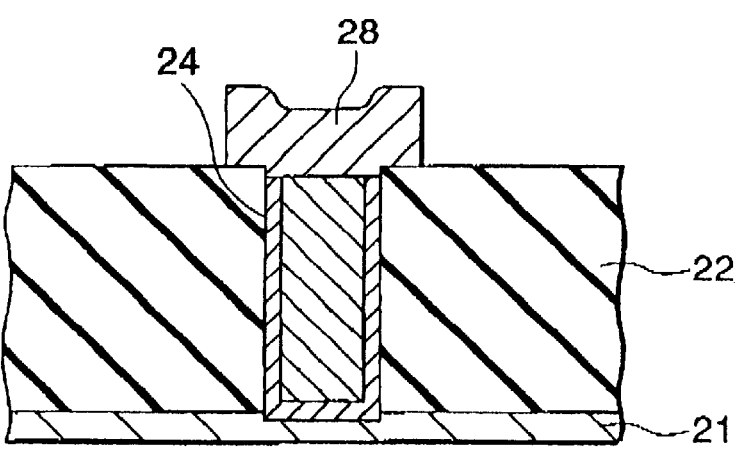

After this, using a not shown resist as a mask, the interconnection metal layer 28a was etched to form interconnections 28 as shown in FIG. 5I. Due to the above process, a contact hole connecting the silicon substrate 21 to the upper interconnections 28 was formed.

In the four cases changed in the etching amount in the step shown in FIG. 5D, the contact resistivities were almost same. Also, these contact resistivities were lowered compared to those in the case of pre-treatment by conventional wet-etching or Ar sputtering. Therefore, it is understood that a contact having a low resistivity and low variability in resistivity can be formed when the etching amount of the native oxide estimated from the thermal oxide film is within a range of at least 1 nm to 7 nm.

According to the Ar sputtering, Ar strikes the bottom of the contact hole vertically and the native oxide is removed physically. Therefore, it was difficult to remove the native oxide near the sidewall of the contact hole. It was necessary to perform the Ar sputtering by 10 nm or more, for example about 18 nm, for removing the native oxide completely. Due to this, the substrate was damaged, which caused an increase of the resistivity of contact.

As opposed to this, according to the method of producing a semiconductor device of the above present embodiment, since etching is performed using an $NF_3$ gas, if reached by the etching gas, the etching reaction progresses at the sidewall of the contact hole and at an interface of the sidewall and bottom surface. Therefore, compared to the conventional methods, it is possible to decrease the etching amount and reduce damage to the substrate or underlying conductive layer.

Second Embodiment

According to a method of producing a semiconductor device of the present embodiment, the etching conditions of the step shown in FIG. 5D of the first embodiment are changed. The etching conditions were an $NF_3$ gas flow of 3 sccm; a He gas flow of 70 sccm; an RF power (1) of 100 W; an RF power (2) of 100 W; a pressure of 5 mTorr ($\approx$0.67 Pa); and a wafer temperature of room temperature.

While the concentration of $NF_3$ according to the etching conditions of the first embodiment was 6%, the concentration of $NF_3$ according to the etching conditions of the second embodiment was 4%. In the second embodiment, the etching rate becomes somewhat slower compared to the first embodiment, so control of the etching amount is made easier. However, the native oxide is removed in an extremely short time with these etching conditions. Therefore, the throughput is not influenced even if the etching rate decreases.

When the etching treatment of the second embodiment was performed before forming the barrier metal layer, almost the same contact resistivity as the first embodiment was obtained. Therefore, it is suggested that the native oxide was removed sufficiently without damage to the silicon substrate even with the etching conditions of the second embodiment.

Third Embodiment

According to the method of producing a semiconductor device of the present embodiment, after the etching step of the first embodiment shown in FIG. 5D, the inside of the etching system is opened to the atmosphere and then the barrier metal layer 26 shown in FIG. 5E is formed. The rest of the method is similar to the first embodiment. According to the present embodiment, in the same way as the first embodiment, it became possible to form a contact having a low resistivity.

Usually, when it opening the system to the atmosphere after removing the native oxide, native oxide is formed again and the contact resistivity increases. However, according to the present embodiment, no increase in resistivity of contact was observed. Although the cause of this is not clear, it is supposed that, for example, fluorine bonded to the silicon terminals by plasma treatment to prevent growth of the native oxide.

Fourth Embodiment

When the diameter of a contact hole is shortened and the aspect ratio of the contact hole increases, the contact resistivity increases. Pre-treatment for forming interconnections was performed by wet-etching using HF, Ar sputtering, or plasma etching using $NF_3$ (4%) and the changes of resistivity of the contact were compared. The contact was formed on silicon. The results are shown in FIG. 6 to 8.

Figure 6:
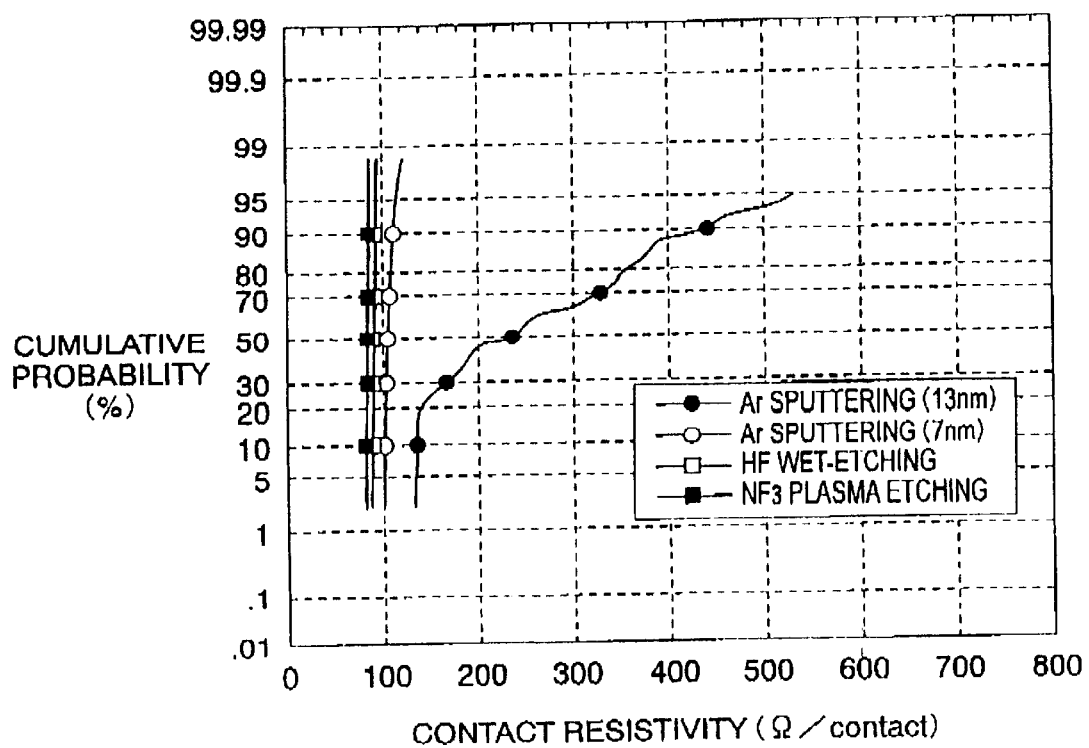
FIGS. 6 to 9 are graphs showing results of a fourth embodiment of the present invention and show a change of the contact resistivity along with an increase in the aspect ratio of a contact hole in the present invention and related art.
Figure 8:
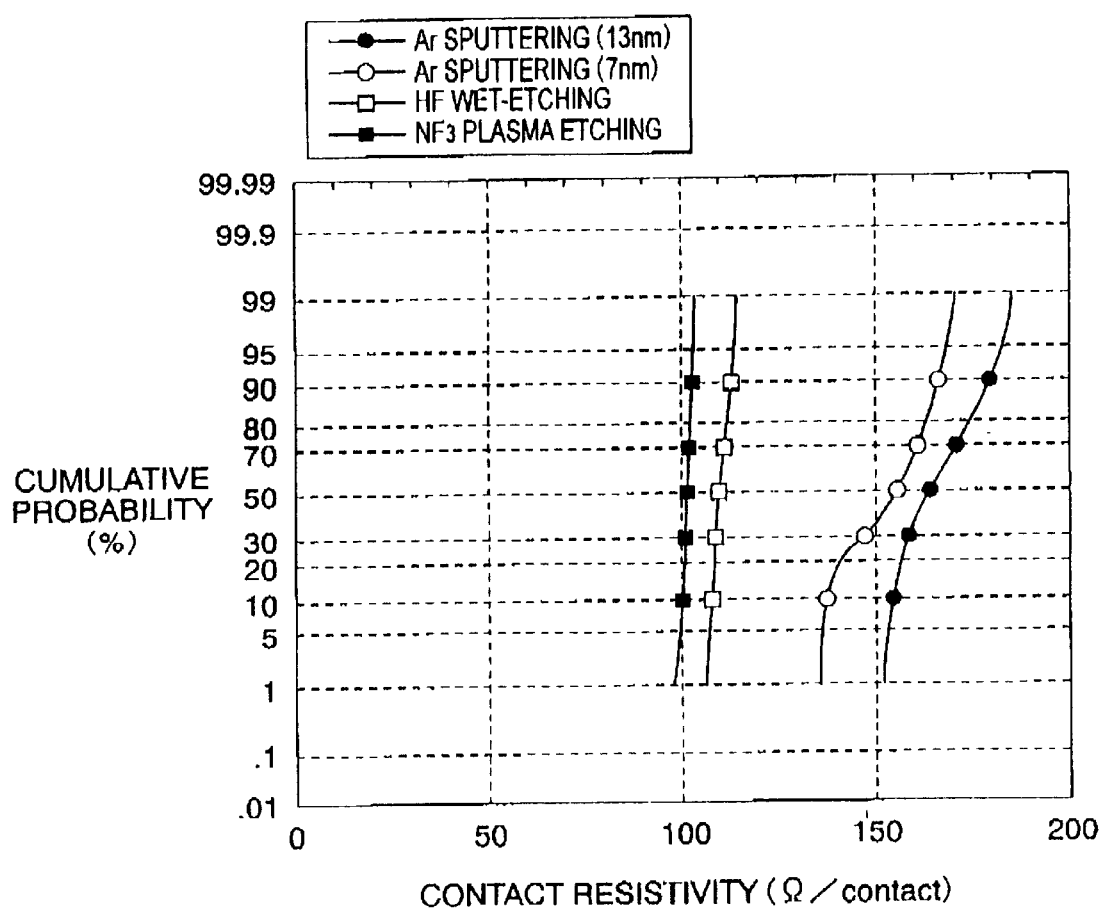
Figure 9:
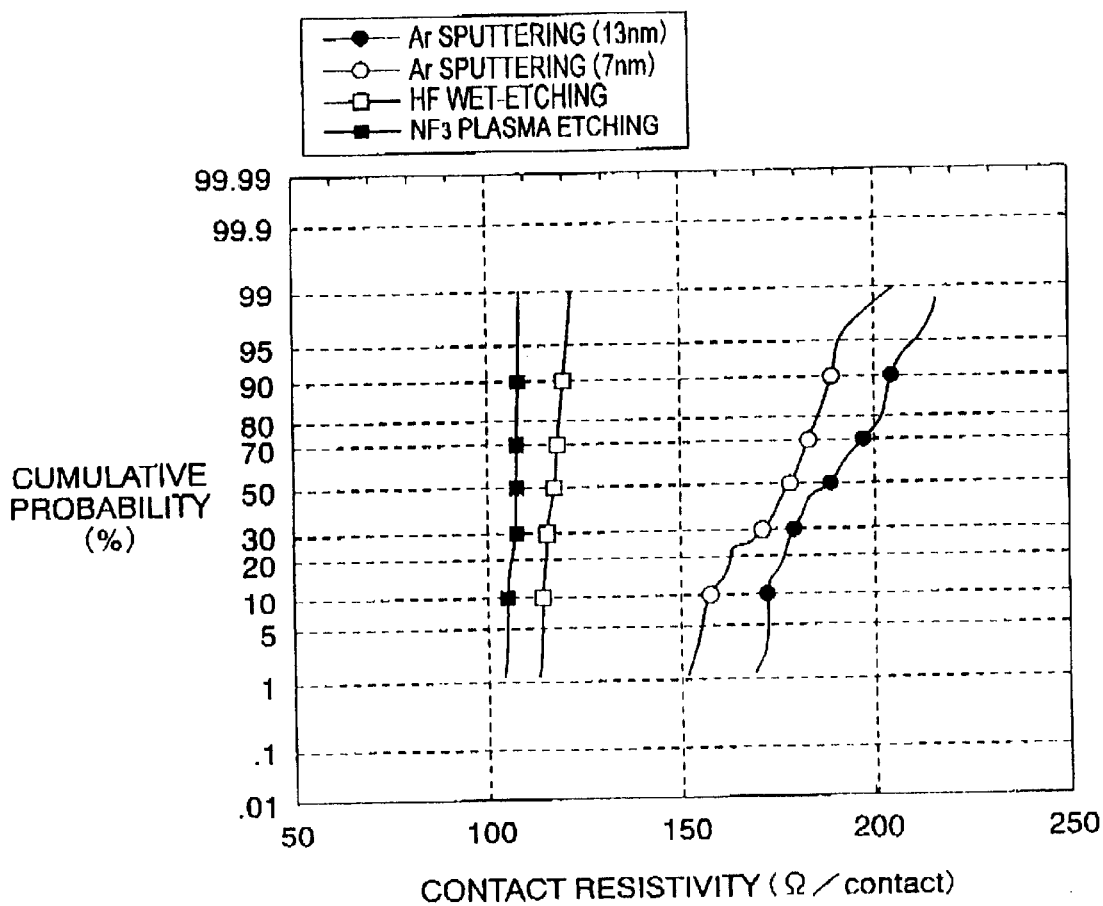

FIG. 6 shows the case where the diameter of the contact hole is 0.4 $\mu$m. FIG. 7 shows the case where the diameter of the contact hole is 0.28 $\mu$m. FIG. 8 shows the case where the diameter of the contact hole is 0.26 $\mu$m. FIG. 9 shows the case where the diameter of the contact hole is 0.24 $\mu$m. These contact holes have the same height. The smaller the diameter of the contact hole, the higher the aspect ratio. These diameters of a contact hole are values of a mask pattern. Below, the amount of etching or amount of Ar sputtering will be represented by values estimated from a thermal oxide film.

As shown in FIG. 6, when the diameter of the contact hole was 0.4 µm, the contact resistivity was clearly high due to 13 nm of Ar sputtering. As opposed to this, in other conditions, that is, 3 nm of wet-etching, 7 nm of Ar sputtering, and 7 nm of plasma etching using $NF_3$, the plots overlapped in the graph and there was no large difference in the contact resistivity.

Figure 7:
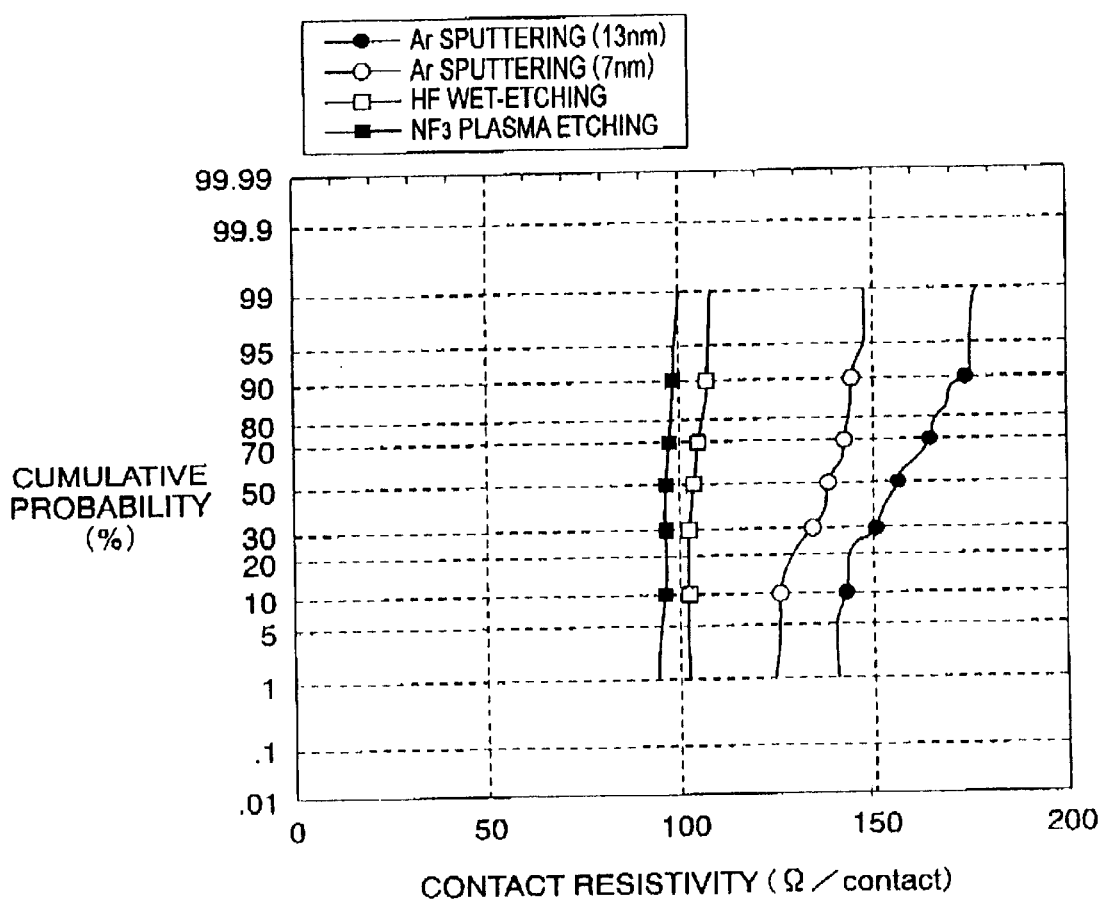

As shown in FIG. 7, when the diameter of the contact hole was 0.28 µm, a low resistivity of the contact similar to the case wherein the diameter of the contact hole was 0.4 µm (see. FIG. 6) was obtained only by plasma etching using $NF_3$. In the case of other pre-treatment, the resistivity increased more than the case wherein the diameter of the contact hole was 0.4 µm. The contact resistivity increased particularly in the case of Ar sputtering. However, in the case of 13 nm of Ar sputtering, the extraordinary increase in resistivity found with a 0.4 µm diameter of the contact hole was not observed.

As shown in FIG. 8, when the diameter of the contact hole is 0.26 µm, the contact resistivity further increases by Ar sputtering or wet-etching compared to the case of 0.28 µm (see FIG. 7). As opposed to this, there is only a slight increase in resistivity of the contact by plasma etching using $NF_3$.

As shown in FIG. 9, when the diameter of the contact hole is 0.24 µm, the contact resistivity clearly increases by Ar sputtering compared to the case of 0.26 µm (see. FIG. 8). Though an increase in the resistivity of the contact is found in the case of wet-etching, it is possible to minimize the change of the resistivity of the contact by plasma etching using $NF_3$.

Fifth Embodiment

Figure 10:
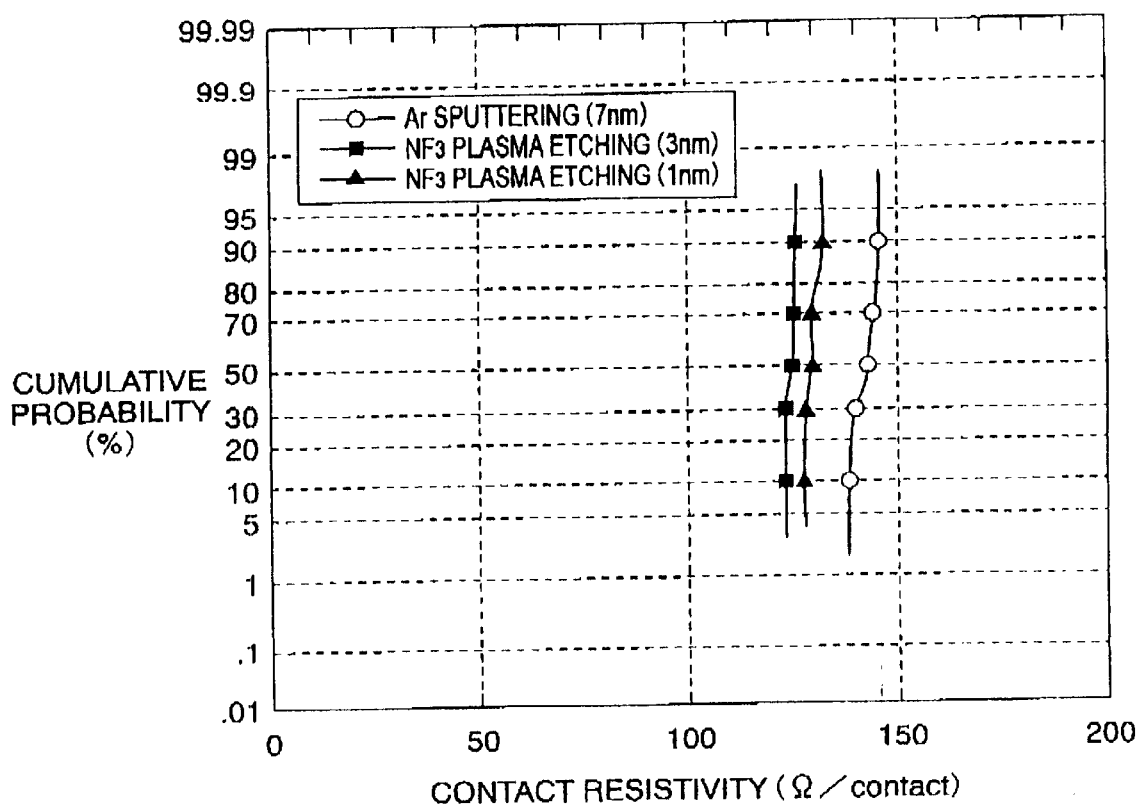
FIG. 10 is a graph showing a result of a fifth embodiment of the present invention and shows a change of the contact resistivity along with a change of an etching amount.

FIG. 10 shows the change of the resistivity of a contact when pre-treatment for forming interconnections was performed by plasma etching using $NF_3$ and the amount of etching was changed. The concentration of $NF_3$ was set at 6%. The contact was formed on silicon. For reference, the resistivity of the contact in the case of 7 nm of Ar sputtering was shown.

As shown in FIG. 10, by plasma etching using $NF_3$ in both cases of 1 nm and 3 nm of etching amounts, the contact resistivity is lowered compared to the case of Ar sputtering.

When the amount of sputtering in the Ar sputtering is decreased to less than 7 nm, the native oxide remains and the contact resistivity further increases. Therefore, the amount of sputtering cannot be lowered.

As opposed to this, since the etching amount of plasma etching using $NF_3$ can be lowered compared to the amount of sputtering of Ar sputtering, it is possible to decrease the damage to the substrate or conductive layer beneath the native oxide.

Sixth Embodiment

Figure 11:
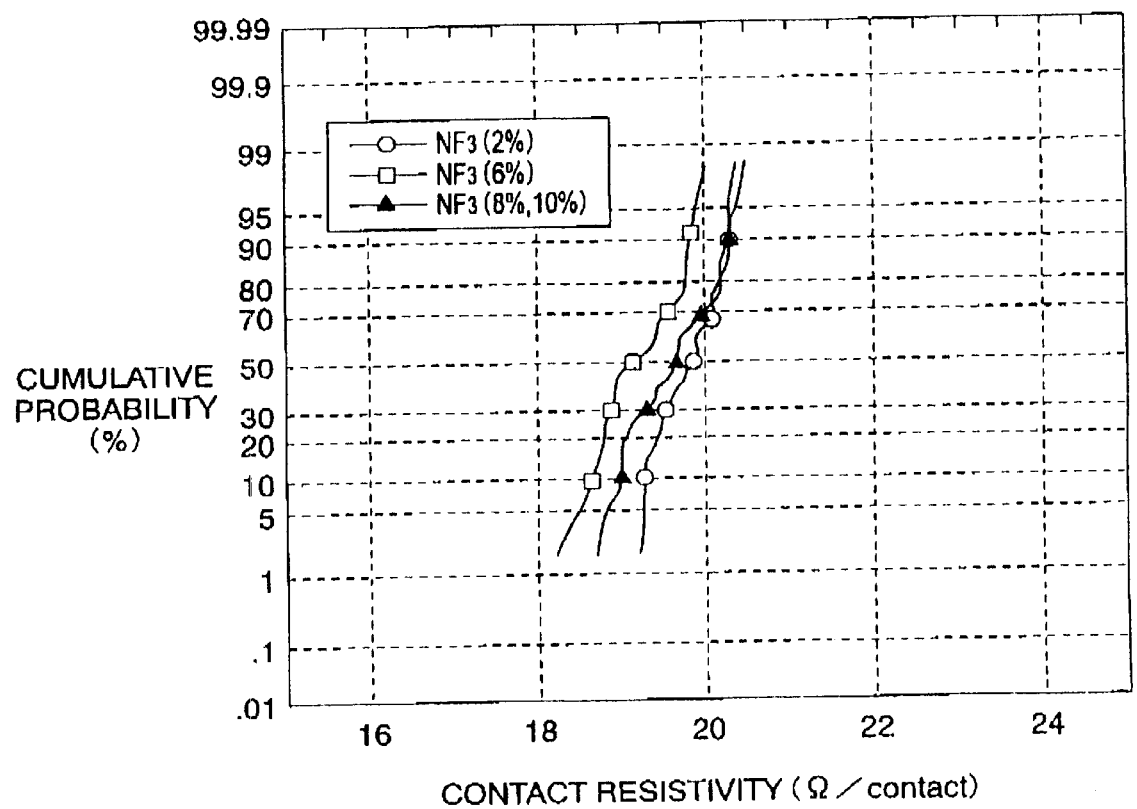
FIG. 11 is a graph showing a result of a sixth embodiment of the present invention and shows a change of the contact resistivity along with a change of concentration of $NF_3$.

FIG. 11 shows the change of the resistivity of the contact when pre-treatment for forming interconnections was performed by plasma etching using $NF_3$ and the concentration of $NF_3$ was changed. The contact was formed on cobalt silicide ($CoSi_x$). In FIG. 11, the plots of $NF_3$ 10% are almost the same as plots of $NF_3$ 8% and overlapped.

As shown in FIG. 11, when the concentration of $NF_3$ is 2%, 6%, 8%, and 10%, a sufficiently low resistivity of the contact is obtained. When the concentration of $NF_3$ is over 10%, an etching rate becomes too high and it becomes difficult to control the etching amount. On the other hand, the lower limit of the concentration of $NF_3$ is not restricted to 2%. It is expected that the contact resistivity can be lowered when the concentration of $NF_3$ is decreased further. However, when the concentration of $NF_3$ is 0%, the etching rate drastically decreases.

Seventh Embodiment

Another plasma etching system than the ICP-type etching system (see. FIG. 4) can be used for plasma etching using $NF_3$ as a pre-treatment for forming interconnections. For example, a parallel plate plasma etching system, electron cyclotron resonance (ECR) plasma etching system, or high density plasma (HDP) etching system can be used, too.

Figure 12:
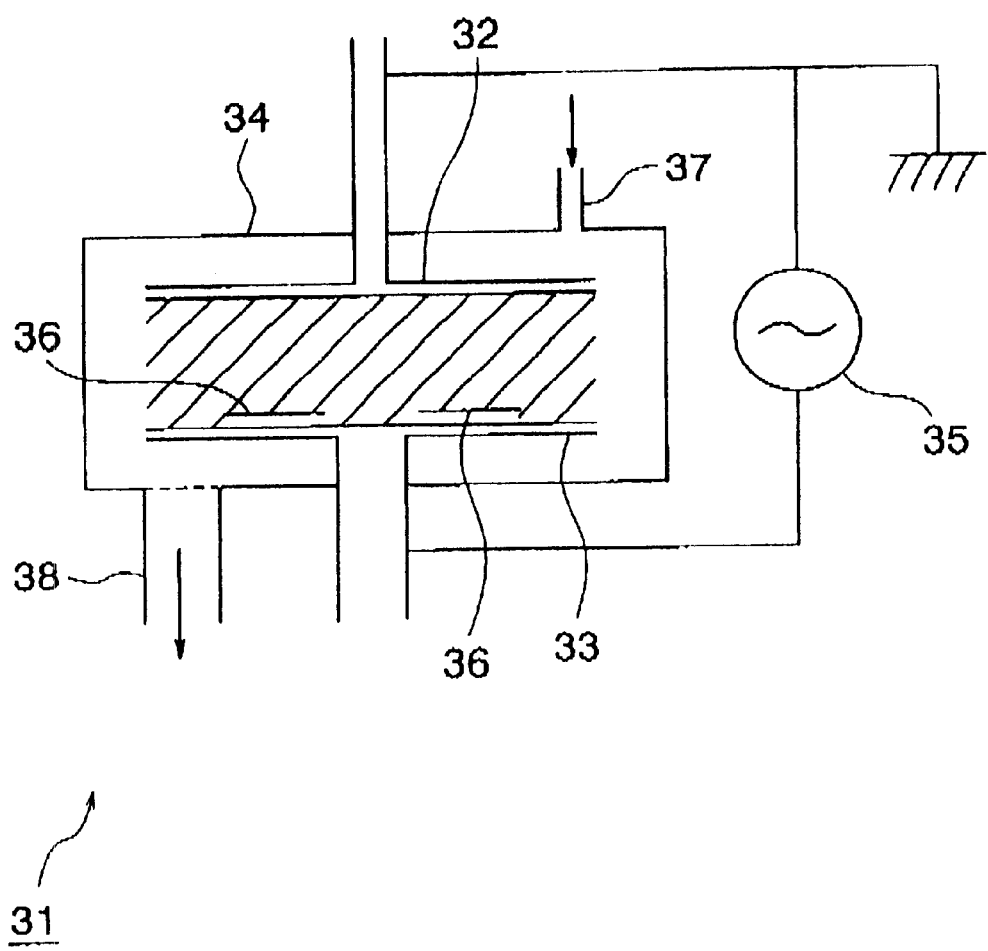
FIG. 12 is a view on a seventh embodiment of the present invention and is a schematic view of a parallel plate plasma etching system able to be used for the method of producing a semiconductor device of the present invention.

FIG. 12 is a schematic view of a parallel plate plasma etching system. In the etching system 31, an upper electrode 32 and lower electrode 33 are placed in parallel in the reaction chamber 34. By supplying radio frequency (RF) power 35 to one of the electrodes, plasma is generated between them. A wafer 36 is placed on the lower electrode 33. The ions in the plasma strike the wafer 36 vertically. An etching gas is introduced from a gas introduction port 37 into the reaction chamber 34 and is exhausted from an exhaust port 38.

Figure 13:
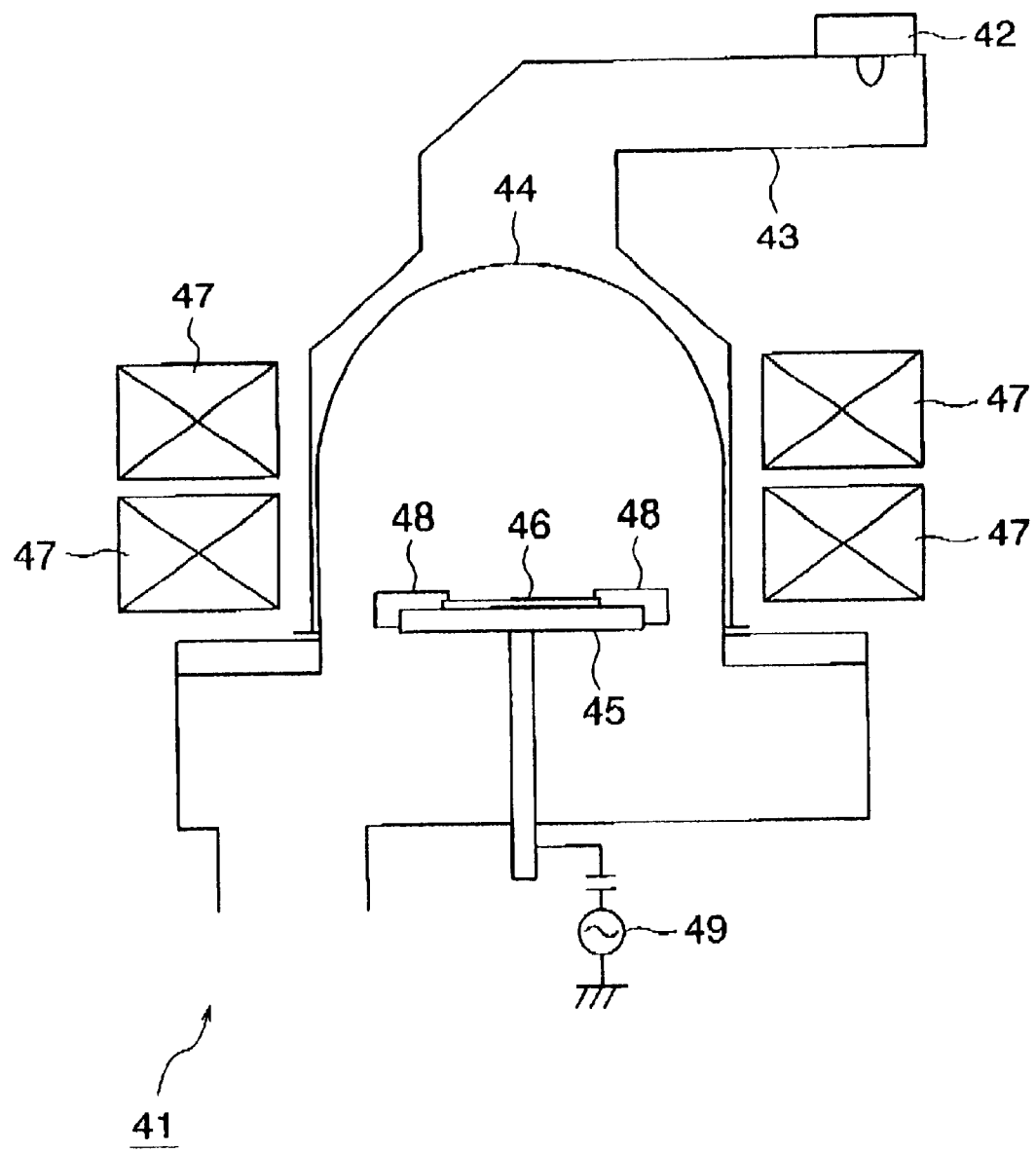
FIG. 13 is a view on a seventh embodiment of the present invention and is a schematic view of an ECR plasma etching system able to be used for the method of producing a semiconductor device of the present invention.

FIG. 13 is a schematic view of an ECR plasma etching system. In the etching system 41 of FIG. 13, a microwave generated at a magnetron 42 travels via a waveguide 43 and a quartz belljar 44 to reach a wafer 46 on a stage 45. Around the quartz belljar 44 is formed a coil 47. The wafer 46 is fixed by an electrostatic chuck or a clamp 48 provided at the stage 45. The stage 45 is connected to an RF power supply 49. A not shown coolant for controlling the temperature is circulated in the stage 45.

Figure 14:
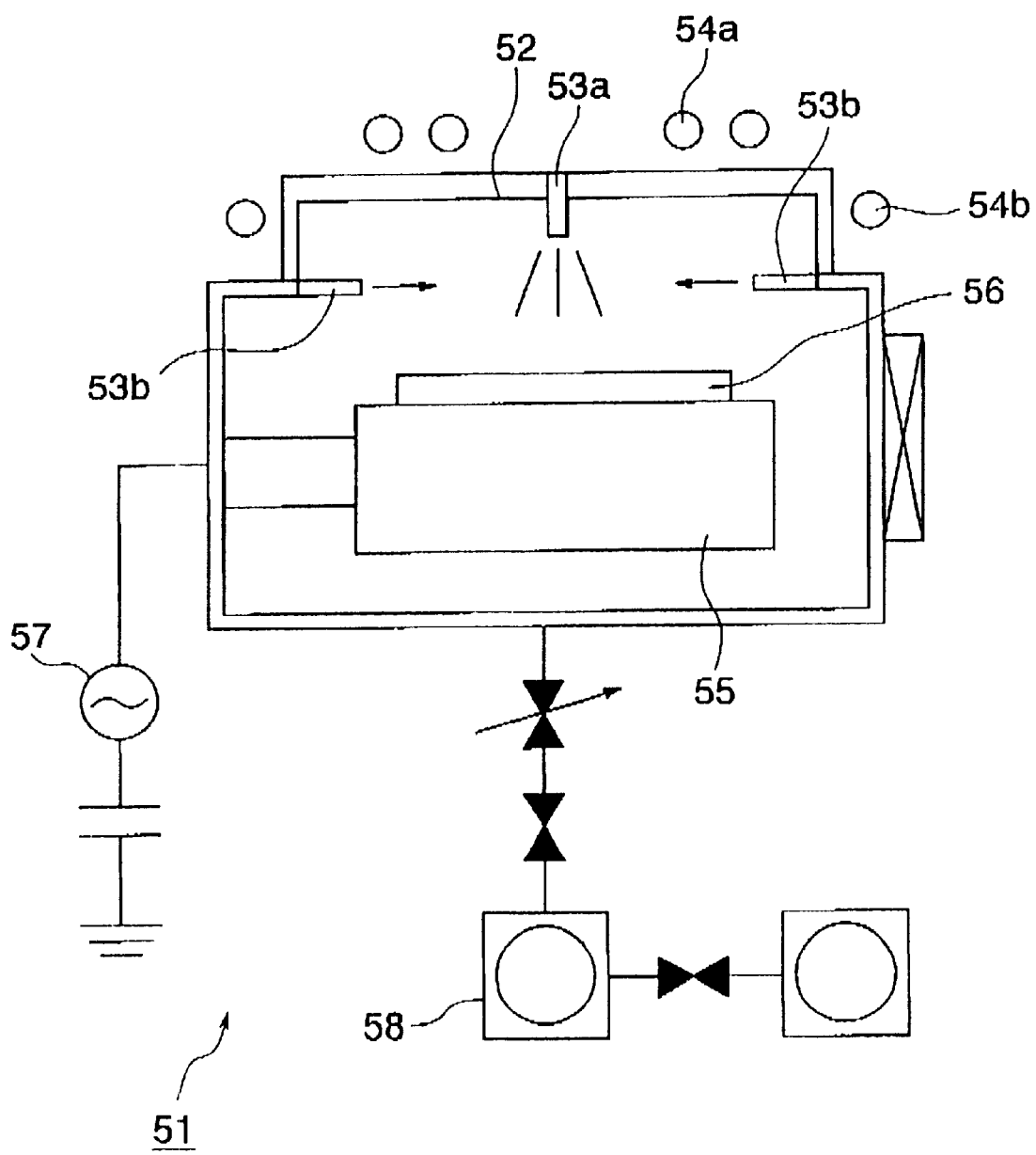
FIG. 14 is a view on a seventh embodiment of the present invention and is a schematic view of an HDP etching system able to be used for the method of producing a semiconductor device of the present invention.

FIG. 14 is a schematic view of an HDP etching system. In the etching system 51 shown in FIG. 14, a reaction chamber 52 is formed with gas introduction ports 53a, 53b. Gases are introduced from the top and side of the reaction chamber 52. A top coil 54a is formed above the reaction chamber 52 and a side coil 54b is formed around the reaction chamber 52. The top coil 54a and side coil 54b are controlled individually. A wafer 56 is placed on a stage 55 in the reaction chamber 52. An electrostatic chuck is provided integrally with the stage 55. The stage 55 is connected to an RF power supply 57. The reaction chamber 52 is exhausted by a pump 58.

When pre-treatment for forming interconnections is performed using the etching system 51 of FIG. 14, the etching conditions are for example an $NF_3$ gas flow of 3 sccm; a He gas flow of 47 sccm; an RF power (1) of 100 W; an RF power (2) of 100W; and a pressure of 4.5 to 8 mTorr ≈0.6 to 1.07 Pa). Here, the RF power (1) is the power supplied to the top coil 54a and the RF power (2) is the power supplied to the side coil 54b.

It is possible to perform pre-treatment for forming interconnections even using the above systems shown in FIGS. 12 to 14 or other plasma etching systems.

According to the above method of producing a semiconductor device of the embodiment of the present invention, it is possible to decrease the contact resistivity and variability of the resistivity of a contact hole having a high aspect ratio.

Note that the present invention is not limited to the above embodiments and includes modifications within the scope of the claims. For example, $NF_3$ can be changed to other fluorine compound gases if the problem of deposition on a sidewall of a contact hole does not arise.

Summarizing the effect of the present invention, according to the method of producing a semiconductor device of the present invention, it becomes possible to prevent a change of shape of a contact hole and form a contact having a low resistivity and low variability in resistivity.

What is claimed is:

1. A method of producing a semiconductor device comprising the steps of:

forming a conductive layer in a substrate; forming a conductive layer on an insulating layer;

forming an opening used as a contact hole in the insulating layer to penetrate the insulating layer and reach the conductive layer;

forming an interconnector layer in the opening in situ after forming the opening; and removing native oxide formed on a surface of the conductive layer at a bottom of the opening by plasma etching using an etching gas containing a fluorine compound gas at a predetermined concentration and a predetermined pressure, the concentration and pressure being determined within a range able to control an etching amount of the native oxide and the fluorine compound gas comprising nitrogen trifluoride ($NE_3$) gas.

2. A method of producing a semiconductor device comprising the steps of:

forming a conductive layer in a substrate;

forming a conductive layer on an insulating layer:

forming an opening used as a contact hole in the insulating layer to penetrate the insulating layer and reach the conductive layer;

forming an interconnector layer in the opening after forming the opening; and removing native oxide formed on a surface of the conductive layer at a bottom of the opening by plasma etching using an etching gas comprising nitrogen trifluoride ($NF_3$) gas at a predetermined concentration and a predetermined pressure, the concentration and pressure are determined within a range able to control an etching amount of the native oxide, an upper limit of the predetermined concentration of the $NF_3$ gas is being about 6%.

3. A method of producing a semiconductor device as set forth in claim 1, wherein the etching gas comprises helium (He) gas.

4. A method of producing a semiconductor device as set forth in claim 1, wherein the predetermined pressure is not more than about 10 mTorr (=1.33 Pa).

5. A method of producing a semiconductor device comprising the steps of:

forming a conductive layer in a substrate;

forming a conductive layer on an insulating layer;

forming an opening used as a contact hole in the insulating layer to penetrate the insulating layer and reach the conductive layer;

forming an interconnector layer in the opening after forming the opening; and removing native oxide formed on a surface of the conductive layer at a bottom of the opening by plasma etching using an etching gas containing a fluorine compound gas at a predetermined concentration and a predetermined pressure wherein, the concentration and pressure are determined within a range able to control an etching amount of the native oxide, and the etching amount is equivalent to about 0.5 to 3 nm of a thermal oxide film.

6. A method of producing a semiconductor device as set forth in claim 1, further comprising the step of forming an interconnection at least in the opening without moving the substrate after the plasma etching.

7. A method of producing a semiconductor device as set forth in claim 1, wherein the plasma etching comprises inductively coupled plasma (ICP) etching generating plasma using electrons accelerated by an induction electric field generated by a high frequency induction magnetic field.

8. A method of producing a semiconductor device as set forth in claim 1, wherein the plasma etching comprises parallel plate etching generating plasma between two electrodes placed in parallel by supplying a high frequency to one of the electrodes and grounding the other electrode.

9. A method of producing a semiconductor device as set forth in claim 1, wherein the plasma etching comprises electron cyclotron resonance (ECR) etching using ECR.

10. A method of producing a semiconductor device as set forth in claim 1, wherein the plasma etching comprises high density plasma (HDP) etching generating plasma by forming a magnetic field from the top and side of a reaction chamber.

11. A method of producing a semiconductor device as set forth in claim 1, wherein the conductive layer comprises a silicon (Si) layer, refractory metal silicide layer, refractory metal layer, refractory metal nitride layer, aluminum (Al) layer, or Al alloy layer.

12. A method of producing a semiconductor device as set forth in claim 11, wherein the refractory metal silicide layer comprises a cobalt silicide ($CoSi_x$) layer, titanium silicide ($TiSi_x$) layer, or tungsten silicide ($Wsi_x$) layer.

13. A method of producing a semiconductor device as set forth in claim 11, wherein the refractory metal layer comprises a titanium (Ti), tungsten (W) layer, or tantalum (Ta) layer.

14. A method of producing a semiconductor device as set forth in claim 11, wherein the refractory metal nitride layer comprises a titanium nitride (TiN) layer, tungsten nitride (WN) layer, or tantalum nitride (TaN) layer.

15. A method of producing a semiconductor device as set forth in claim 11, wherein the Al alloy layer comprises an Al—Cu layer.

* * * * *